United States Patent [19]

Herscher et al.

[11] Patent Number: 4,958,294
[45] Date of Patent: Sep. 18, 1990

[54] SWEPT MICROWAVE POWER MEASUREMENT SYSTEM AND METHOD

[75] Inventors: Bret A. Herscher, Mt. Vien; Paul R. Munro, Sunnyvale, both of Calif.

[73] Assignee: Wavetek Microwave, Inc., Sunnyvale, Calif.

[21] Appl. No.: 176,729

[22] Filed: Apr. 1, 1988

[51] Int. Cl.$^5$ .................. G01R 19/00; G06F 15/46
[52] U.S. Cl. ................................. 364/483; 324/77 B; 324/601; 324/637; 364/484; 364/571.01; 364/571.02
[58] Field of Search .................. 364/571.01–571.07, 364/483, 484, 487, 570, 572; 375/10, 60, 94; 324/77 A, 77 B, 77 F, 57 R, 57 PS, 57 SS, 99 D, 58 R, 58.5 R

[56] References Cited

U.S. PATENT DOCUMENTS

| | | | |
|---|---|---|---|
| 4,381,485 | 4/1983 | Steinbrecher | 324/58 R |
| 4,414,638 | 11/1983 | Talambiras | 364/571.07 |
| 4,418,392 | 11/1983 | Hata | 364/571.07 |
| 4,556,841 | 12/1985 | Carlson | 324/58 R |
| 4,652,816 | 3/1987 | Crookshanks | 364/571.04 |
| 4,667,151 | 5/1987 | Crookshanks | 364/571.01 |
| 4,680,538 | 7/1987 | Dalman et al. | 324/58 R |
| 4,703,433 | 10/1987 | Sharrit | 364/487 |
| 4,713,608 | 12/1987 | Catiller et al. | 364/483 |
| 4,758,776 | 7/1988 | Griffin | 324/58.5 B |
| 4,777,429 | 10/1988 | Potter | 324/58.5 B |

OTHER PUBLICATIONS

"Peak RF and Microwave Power Measurements-Application Note #AN26"; Wavetek Microwave, Inc.; 1985; pp. 1–12.

Primary Examiner—Kevin J. Teska
Attorney, Agent, or Firm—Donald J. Lisa; John R. Mugno

[57] ABSTRACT

A swept microwave power measurement system and method capable of performing accurate high performance absolute power measurements on the fly for integration with a scalar analyzer. The system interpolates a calibration factor of the detector at a given frequency point in the sweep between previously established calibration factors at various predetermined frequencies which are stored in memory and then determines an "apparent" power level of the input signal at a standard frequency. The interpolated calibration factor is applied to the "apparent" power level to determine the "absolute" power level at the given frequency point in the sweep.

29 Claims, 2 Drawing Sheets

SWEPT MICROWAVE POWER MEASUREMENT SYSTEM AND METHOD

BACKGROUND OF THE INVENTION

The present invention relates, in general, to the field of precision scalar network analyzers. More particularly, the present invention relates to a swept microwave power measurement system and method which determines "absolute" power by applying an interpolated correction factor determined at any given frequency during a sweep to the "apparent" power output at a predetermined frequency.

In the past, scalar analyzers have been used to measure magnitude only reflection and transmission characteristics of microwave components. The relatively low cost, high speed and simple operation of scaler analyzers have been their fundamental attraction. However, their limited power measurement accuracy (+/−1 to 2 dB) have often kept them in the role of qualitative limit line testing or intermediate screening devices instead of being capable of more precise quantitative analysis.

Therefore, it has been necessary to use scalar analyzers in association with accurate, high performance power meters when accurate power measurement is required. This is necessitated by virtue of the fact that a conventional scalar network analyzer does not have the capability of accurately measuring microwave power, since scalar measurements are, per se, power ratio measurements. It is for this reason that active component manufacturers are forced to make power measurements with a separate instrument such as a microwave power meter. In addition to the added equipment cost, this operation involves considerable extra measurement time per part. Nevertheless, the combination of a scalar analyzer and a power meter still renders it very difficult to make exact measurements of power level at many different frequencies without laborious effort on the part of an operator and swept absolute measurements are impossible.

It would therefore be highly desirable to incorporate an accurate power measurement capability into a scalar analyzer. Further, the ability to make high performance, swept absolute power measurements would be a fundamental advantage. Absolute power measurements are required to set up critical drive levels to components such as mixers, or to measure critical output levels such as the compression point of amplifiers. And, while absolutely flat linearity is essential for ratio and relative measurements conventionally made by scalar analyzers, more is demanded for absolute power measurements. The two major specifications for such a system would be an accurate, traceable 1 mW calibration reference to set absolute power at a known frequency (which is typically 50Mhz) as well as an accurate frequency response curve for the power sensor.

SUMMARY OF THE INVENTION

It is therefore an object of the present invention to provide an improved, swept microwave power measurement system and method.

It is further an object of the present invention to provide an improved swept microwave power measurement system and method which allows for accurate power measurement capability in a scalar analyzer.

It is still further an object of the present invention to provide an improved swept microwave power measurement system and method which is capable of rapidly and accurately measuring absolute power obviating the necessity of a separate power meter.

It is still further an object of the present invention to provide an improved swept microwave power measurement system and method which allows swept absolute power measurements to be performed.

The foregoing and other objects and features of the present invention are achieved in the present invention wherein there is provided a system and method for determining the absolute power of an input signal which comprises the steps of providing a detector calibrated at a plurality of predetermined frequencies n over a range of $F_{min}$ to $F_{max}$. A predetermined calibration factor $K(F_n)$ for the detector at each of the predetermined frequencies n is stored and a frequency $F_{in}$ of the input signal is determined. A calibration factor $K(F_{in})$ of the input signal is interpolated and an apparent power level $P_{app}$ of the input signal with respect to a frequency standard is established. The apparent power level $P_{app}$ is corrected to the absolute power level $P_{abs}$ by application of $K(F_{in})$.

BRIEF DESCRIPTION OF THE DRAWINGS

The above mentioned, and other features and objects of the present invention and the manner of attaining them will become more apparent and the invention will be best understood by reference to the following description of an embodiment of the invention taken in conjunction with the accompanying drawings wherein.

DESCRIPTION OF A PREFERRED EMBODIMENT

Figure 1:
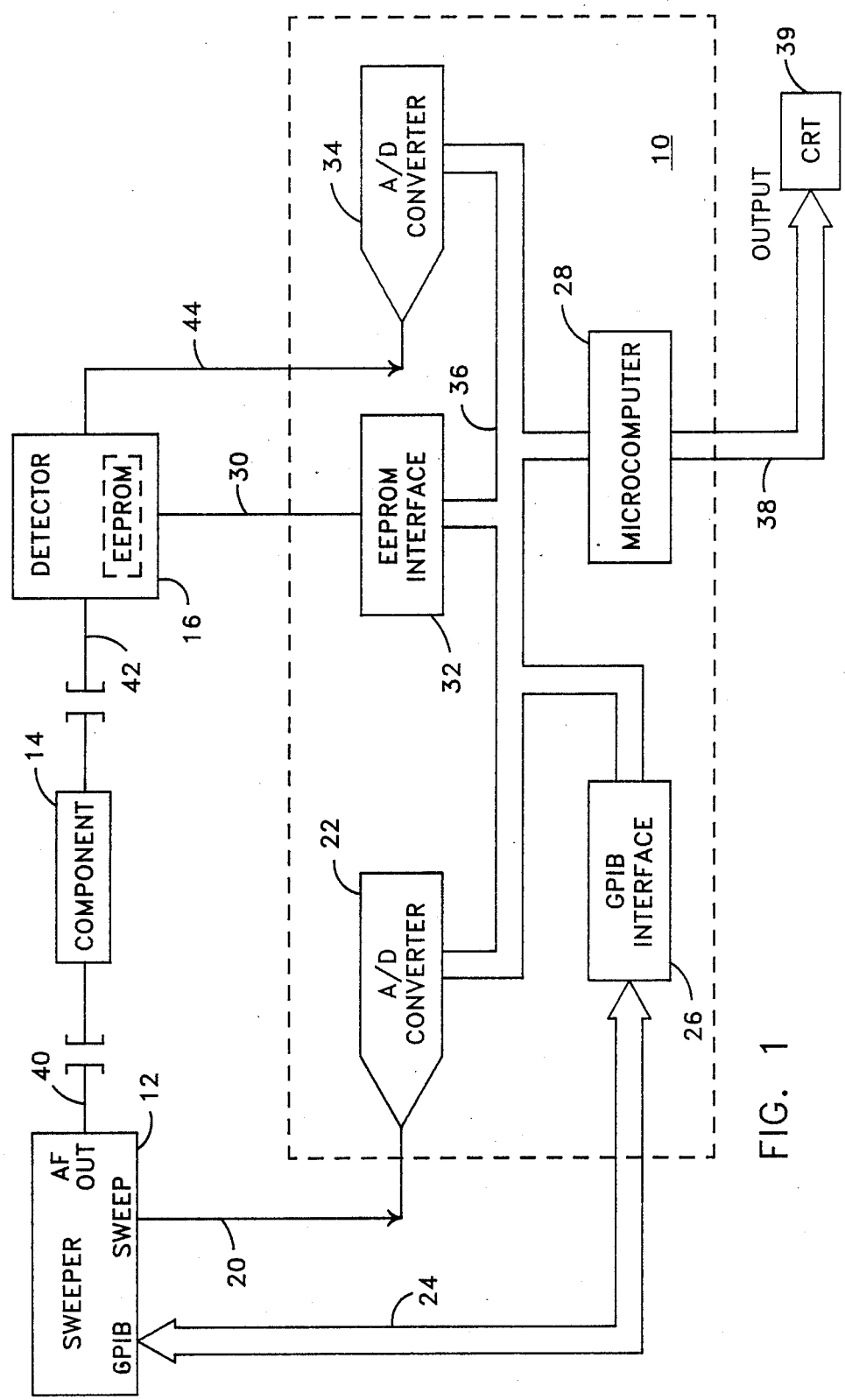
FIG. 1 is a functional block diagram of a swept microwave power measurement system and method in accordance with the present invention for measuring, inter alia, absolute power output from a sweeper signal source or a component under test over the entire range of frequencies produced by the sweeper.

With reference to FIG. 1, a power measurement system 10 in accordance with the present invention is shown. Power measurement system 10 in conjunction with detector 16 functions to determine the absolute power output of sweeper 12 in conjunction with component 14 under test. Sweeper 12 provides an output microwave signal over its frequency range from $F_{min}$ to $F_{max}$ appearing on RF output line 40. Component 14, if an active device, would heretofore have necessitated power measurements by means of a supplemental microwave power meter. However, using power measurement system 10, absolute power from component 14 appearing on detector input line 42, may be performed in conjunction with the other functions of a network scalar analyzer.

In essence, an analyzer incorporating power measurement system 10 would comprise a very wide dynamic range linear amplifier and digitizer. This would permit the linear detector voltage ($V_{det}$) appearing on detector output voltage line 44 from detector 16 to be measured. This linear voltage is directly related to, but is not proportional to the RF power incident on the power sensor of detector 16. As a consequence, a very precisely controlled calibrator must be used to stimulate the sensor at a variety of power levels whereupon the response is measured. U.S. Pat. No. 4,794,325 issued on Dec. 27, 1988, by of Ralph H. Britton and Bret A. Herscher for a "Calibrated Power Detector" discloses a method and system for linearizing the sensor of Detector 16 This must be accomplished to the level of accuracy required by a power meter which is typically on the order of 0.01 dB per 10 dB. The aforementioned application, likewise assigned to the assignee of the present invention and the disclosure of which is hereby specifically incorporated by reference, is illustrative of one method for providing a stable reference signal against which the sensor of detector 16 must be normalized.

In the embodiment shown, EEPROM 18 is housed within detector 16 to provide the frequency correction information necessary to permit accurate power measurements at frequencies other than that of the calibrator. That is, it contains the relevant sensitivity of the detector 16 sensor at an arbitrary frequency relative to its sensitivity at the calibration frequency. Therefore, EEPROM 18 stores calibration factors as a function of frequency for each sensor over a range of approximately 50 MHz to 40 GHz typically. In each instance, the calibration factor changes with the frequency response of the sensor of detector 16. In general, calibration factor information usually has to be traceable to the National Bureau of Standards (NBS) to ensure that the power measured conforms with national standards.

Generally speaking, a signal $V_{det}$ is applied from the output of detector 16 to power measurement system 10. In like manner, sweep voltage line 20 provides a signal $V_{sweep}$ to another input of power measurement system 10. Sweeper 12 and power measurement system 10 are further connected digitally by means of a general purpose interface bus (GPIB) as shown. Sweep voltage line 20 provides an analog input signal to A to D convertor 22 and detector output voltage line 44 provides an input to A to D convertor 34. EEPROM 18 is electrically coupled to EEPROM interface 32 by means of serial bus 30. GPIB interface 26 is connected to a common data bus with A to D convertors 22, 34, EEPROM interface 32 and microcomputer 28. Digital output of microcomputer 28 for subsequent display or other functional operations is taken at output bus 38.

Figure 2:
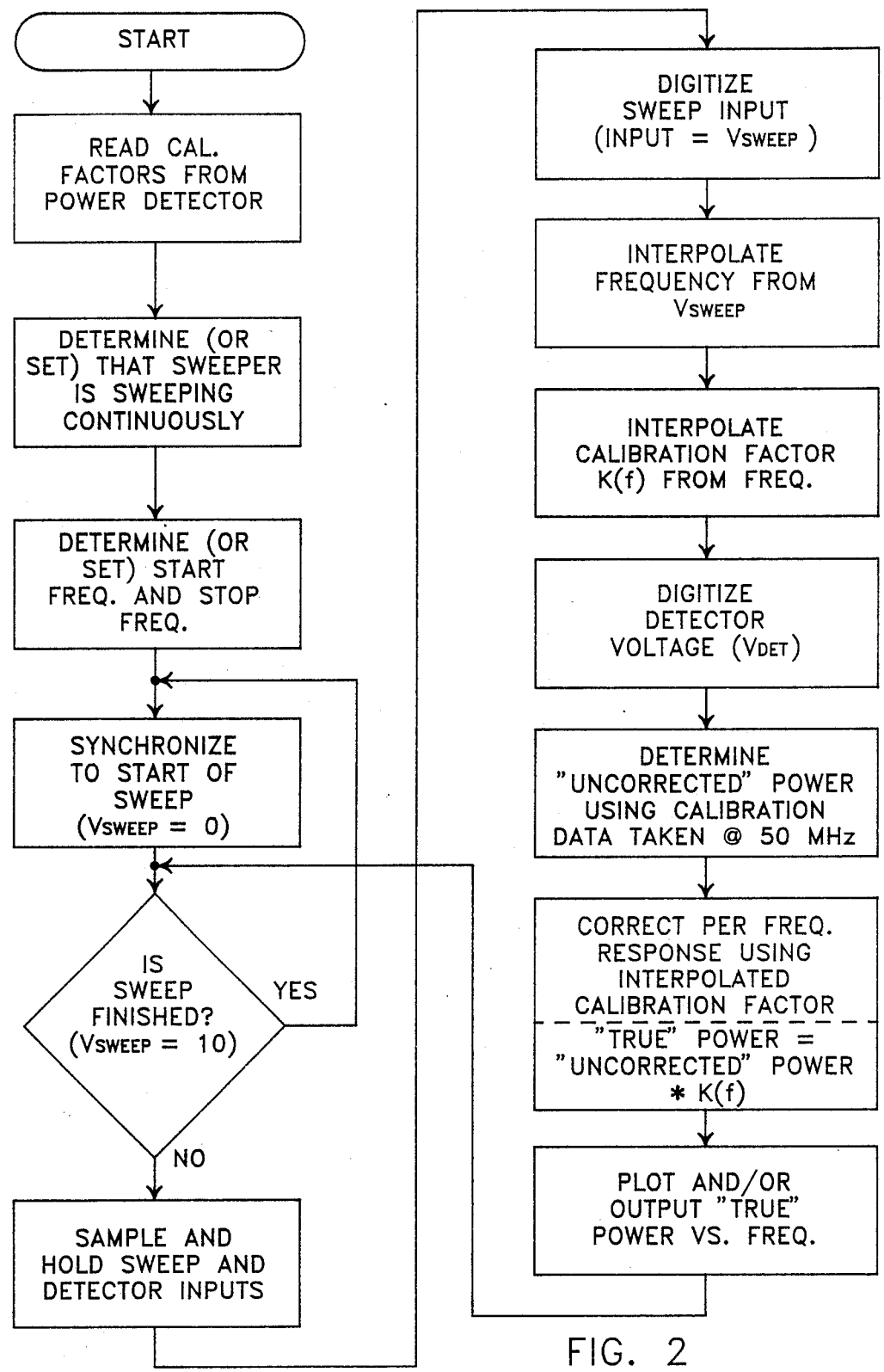
FIG. 2 is a logic flow diagram illustrative of the operation of the embodiment of FIG. 1 for determining absolute power from apparent power and an interpolated correction factor at a specific frequency in the range of the sweeper.

Referring additionally now to FIG. 2, a simplified logic flow diagram for effectuating the swept absolute power measurement by power measurement system 10 is shown. The aforementioned calibration factors stored in EEPROM 18 are read into EEPROM interface 32 over serial bus 30 when detector 16 is plugged into power measurement system 10. These calibration factors, which are a function of frequency, are read into the EEPROM interface 32 for subsequent use in interpolation between points to find a calibration factor at that specific frequency.

Sweep voltage ($V_{sweep}$) appearing on sweep voltage line 20 allows power measurement system 10 to determine that sweeper 12 is sweeping continuously. $V_{sweep}$ ramps generally from a starting level of 0 volts corresponding to $F_{min}$ to 10 volts corresponding to $F_{max}$. In this manner, $V_{sweep}$ can be utilized to accurately determine the particular frequency of the microwave output signal on RF output line 40 at any instant. Further, power measurement system 10 is aware that sweeper 12 is sweeping continuously as well as the precise starting and stopping frequencies of the sweep by means of GPIB interface 26 coupled to GPIB bus 24.

Upon detection of the start of a frequency sweep output from sweeper 12, power measurement system 10 synchronizes itself to sweeper 12. Sweep voltage line 20 is monitored by microcomputer 28 through A to D convertor 22 by means of data bus 36. When the sweep of sweeper 12 is completed, that is, $V_{sweep}=10$ volts, power measurement system 10 again synchronizes to the output of sweeper 12. During the interval between $V_{sweep}=0$ and $V_{sweep}=10$, the signals appearing on sweep voltage line 20 and detector output voltage line 44 are sampled, held and digitized for application to data bus 36. The frequency at that given instant is interpolated by microcomputer 28 linearly between $V_{sweep}$ corresponding to $F_{min}$ and $V_{sweep}$ corresponding to $F_{max}$. Thereafter, microcomputer 28 likewise linearly interpolates a calibration factor $K(F_{in})$ from the calibration factor data which has been read into EEPROM interface 32. Thus, a specific calibration factor is determined at the specific frequency detected as output from sweeper 12.

The output of detector 16 appearing on detector output voltage line 44 ($V_{det}$) is digitized by means of A to D convertor 34 and applied to data bus 36 for analysis by microcomputer 28. An "uncorrected" or "apparent" power is determined using calibration data taken at 50 MHz calibrated in accordance with NBS standards. Since $V_{det}=f(P_{in}, F)$ or $f(P_{in}) \times g(F)$, defining $g(F)$ to be 1 at 50 MHz leaves $V_{det}=f(P_{in})$ in an "apparent" sense; but $F_{in}$ is not equal to 50 MHz.

From this value however, a "true" or "absolute" power is determined by applying the interpolated correction factor $K(F_{in})$ at that given frequency. Thereupon, power measurement system 10 may plot on a CRT 39 or otherwise output the "absolute" power versus frequency in supporting the usual scalar analyzer capabilities. This display may illustrate swept absolute power and be made sufficiently rapid to allow real time tuning of a component.

What has been provided therefore is an improved swept microwave power measurement system and method which allows for accurate power measurement capability in a scalar analyzer. The improved swept microwave power measurement system and method of the present invention is capable of rapidly and accurately measuring absolute power, obviating the necessity of a separate power meter and which allows swept absolute power measurements to be performed.

While there have been described above the principles of the present invention in conjunction with specific apparatus and circuitry, it is to be clearly understood that the foregoing description is made only by way of example and not as a limitation to the scope of the invention.

What is claimed is:

1. A method for determining a swept absolute power level ($P_{abs}$) of an input signal within a scalar analyzer comprising the steps of:

providing a detector calibrated at a plurality of predetermined frequencies (n) over a range of $F_{min}$ to $F_{max}$;

storing a predetermined calibration factor ($K(F_n)$) for said detector at each of said predetermined frequencies n;

determining a frequency ($F_{in}$) of said input signal;

interpolating a calibration factor $K(F_{in})$ of said input signal wherein said calibration factor $K(F_{in})$ is one of said predetermined calibration factors ($K(F_n)$);

establishing an apparent power level ($P_{app}$) of said input signal with respect to said calibration factor of a predetermined frequency standard; and correcting said apparent power level $P_{app}$ to said swept absolute power level $P_{abs}$ by application of $K(F_{in})$.

2. The method of claim 1 wherein said step of providing is carried out by calibrating said detector with respect to NBS Standards.

3. The method of claim 1 wherein said step of interpolating is carried out by means of a linear interpolation between calibration factors immediately preceding and succeeding said frequency $F_{in}$.

4. The method of claim 1 wherein said step of storing is carried out by means of an EEPROM associated with said detector.

5. The method of claim 4 additionally comprising the step of reading said calibration factors $K(F_{in})$ from said EEPROM into an EEPROM interface.

6. The method of claim 1 wherein said predetermined frequency standard is 50 MHz.

7. The method of claim 6 wherein said step of measuring is carried out by means of an A to D convertor.

8. The method of claim 1 wherein said step of determining is carried out by measuring an analog sweep signal.

9. The method of claim 8 wherein said step of measuring is carried out by means of an A to D convertor.

10. The method of claim 8 wherein said step of determining is further carried out by means of a plurality of digital control signals coupling a source of said input signal with a microcomputer.

11. The method of claim 1 wherein said input signal is a swept signal.

12. The method of claim 11 further comprising the step of displaying a visual representation of swept absolute power.

13. The method of claim 12 wherein said step of displaying is carried out by means of a CRT.

14. The method of claim 12 wherein said step of displaying is sufficiently rapid to allow real time tuning of a component.

15. A system within a scalar analyzer for determining a swept absolute power level ($P_{abs}$) of an input signal from a source comprising:

means coupled to said source for detecting said input signal calibrated at a plurality of predetermined frequencies (n) over a range of $F_{min}$ to $F_{max}$;

means coupled to said detecting means for storing a predetermined calibration factor ($K(F_n)$) at each of said predetermined n frequencies;

means coupled to a sweep voltage line of said source for determining a frequency ($F_{in}$) of said input signal;

means coupled to said determining means for interpolating a calibration factor $K(F_{in})$ of said input signal;

means coupled to said interpolating means for establishing an apparent power level ($P_{app}$) of said input signal with respect to a frequency standard; and, means coupled to said establishing means for correcting said apparent power level $P_{app}$ to said swept absolute power level $P_{abs}$ by application of said calibration factor $K(F_{in})$.

16. The system of claim 15 wherein said means for detecting comprises a microwave sensor calibrated to NBS standards.

17. The system of claim 15 wherein said means for interpolating comprises a microcomputer having as inputs said calibration factors ($K(F_n)$) and a digital signal representative of said frequency $F_{in}$.

18. The system of claim 15 wherein said means for correcting comprises a microcomputer having as input said apparent power level and said calibration factor $K(F_{in})$.

19. The system of claim 15 wherein said means for storing comprises an EEPROM.

20. The system of claim 19 further comprising an EEPROM interface serially coupled to said EEPROM.

21. The system of claim 15 wherein said means for determining comprises an A to D convertor coupled to a sweep voltage line.

22. The system of claim 21 further comprising a digital control signal bus coupled between said system and a source of said input signal.

23. The system of claim 15 wherein said means for establishing comprises an A to D convertor having as an input a signal $V_{det}$ from said detecting means.

24. The system of claim 23 wherein said means for establishing further comprises a microcomputer coupled to said A to D convertor.

25. The system of claim 24 wherein said frequency standard is 50 MHz.

26. The system of claim 15 wherein said input signal is a swept signal.

27. The system of claim 26 further comprising means for displaying a visual representation of swept absolute power.

28. The system of claim 27 wherein said displaying means comprises a CRT.

29. The system of claim 27 additionally comprising a component under test coupled between said swept signal and said means for detecting wherein said displaying means is sufficiently rapid to allow real time tuning of the component.

* * * * *